(12) United States Patent
Mendel et al.

(10) Patent No.: US 8,751,998 B2
(45) Date of Patent: Jun. 10, 2014

(54) METHOD AND SYSTEM FOR PARTIAL RECONFIGURATION SIMULATION

(75) Inventors: David W. Mendel, Sunnyvale, CA (US); Marwan A. Khalaf, San Carlos, CA (US); Renxin Xia, Saratoga, CA (US)

(73) Assignee: Altera Corporation, San Jose, CA (US)

(*) Notice: Subject to any disclaimer, the term of this patent is extended or adjusted under 35 U.S.C. 154(b) by 151 days.

(21) Appl. No.: 13/369,218

(22) Filed: Feb. 8, 2012

(65) Prior Publication Data

US 2013/0007687 A1 Jan. 3, 2013

Related U.S. Application Data

(60) Provisional application No. 61/504,117, filed on Jul. 1, 2011.

(51) Int. Cl.
*G06F 11/22* (2006.01)
*G06F 17/50* (2006.01)

(52) U.S. Cl.
USPC ............ 716/136; 716/110; 716/116; 716/117

(58) Field of Classification Search
USPC ......................................................... 716/136
See application file for complete search history.

(56) References Cited

U.S. PATENT DOCUMENTS

| | | | |
|---|---|---|---|
| 7,490,311 B1 * | 2/2009 | Payette | 716/138 |
| 7,565,280 B2 * | 7/2009 | Moriat | 703/22 |
| 2010/0283505 A1 * | 11/2010 | Koch et al. | 326/41 |

OTHER PUBLICATIONS

European Search Report dated Sep. 21, 2012 issued in EP 12 173 503.9.
Robinson, et al. (2000) "Methods of Exploiting Simulation Technology for Simulating the Timing of Dynamically Reconfigurable Logic." IEE Proceedings E. Computers & Digital Techniques, Institution of Electrical Engineers vol. 147, No. 3, pp. 175-180.

* cited by examiner

*Primary Examiner* — Jack Chiang
*Assistant Examiner* — Eric Lee
(74) *Attorney, Agent, or Firm* — Weaver Austin Villeneuve & Sampson LLP

(57) ABSTRACT

Disclosed is a method of simulating partial reconfiguration of a programmable logic device (PLD). A wrapper module is incorporated into a logic description that may be implemented in a PLD. The wrapper module represents a first logic design. In response to receiving a parameter, the wrapper module changes to represent a second logic design. According to various embodiments, the logic description is a simulatable source file. The simulatable source file is a source file that is used by a simulation program to simulate partial reconfiguration of the logic design. The wrapper module of the simulatable source file receives a run-time parameter. In various embodiments, the logic description is a synthesizable source file. The synthesizable source file is a source file that is used by a synthesis tool to compile the source file into hardware. The wrapper module of the synthesizable source receives a compile-time parameter.

20 Claims, 5 Drawing Sheets

METHOD AND SYSTEM FOR PARTIAL RECONFIGURATION SIMULATION

PRIORITY AND RELATED APPLICATION DATA

This application claims priority and benefit to co-pending and commonly assigned U.S. Provisional Patent Application No. 61/504,117, titled METHOD AND SYSTEM FOR PARTIAL RECONFIGURATION, by David Mendel et al., filed on Jul. 1, 2011, which is hereby incorporated by reference in its entirety and for all purposes.

TECHNICAL FIELD

The present disclosure generally relates to integrated circuits. More specifically, the present disclosure relates to techniques and systems for simulating and implementing an integrated circuit.

DESCRIPTION OF RELATED ART

A programmable logic device (PLD) is a semiconductor integrated circuit that contains logic circuitry that can be programmed to perform a host of logic functions. In a typical scenario, a logic designer uses computer-aided design (CAD) tools to design a custom logic circuit. These tools use information regarding the hardware capabilities of a given programmable logic device to help the designer implement the custom logic circuit using multiple resources available on that given programmable logic device. In many instances, a programmable logic device may support partial reconfiguration, or the ability to have part of its logic reconfigured to other functionalities while other parts of the PLD remain active.

Partial reconfiguration offers the capability of having a portion of the programmable logic device configured with different logic or code at different times. However, conventional hardware simulators do not support the ability to configure a portion of a programmable logic device with a different version of logic or code mid-simulation. Thus, mechanisms for simulating partial reconfiguration are limited and hindered.

OVERVIEW

Embodiments of the present invention are directed to simulating partial reconfiguration of a programmable logic device. Partial reconfiguration is a process in which a reconfigurable region, or regions, of a programmable logic device may be reconfigured with new functionalities while other region(s) of the programmable logic device remains fixed, and continues to execute already implemented functionality.

According to various embodiments, a constant interface is provided between a fixed region and a reconfigurable region. In various embodiments a constant interface may refer to a communicative interface between a fixed region and a reconfigurable region that provides the ability to communicate between regions regardless of what design is implemented within the reconfigurable region during partial reconfiguration. Simulation remains operational and continues to function as different reconfigurable region(s) is reconfigured. In particular embodiments, a wrapper module represents the reconfigurable region(s). Functionality of the reconfigurable region may vary based on an input or parameter.

According to various embodiments, the input may be received by a computing system to simulate the programmable logic device. The input may indicate a configuration of a logic description that may be implemented on the programmable logic device. The input may include signals indicating a first design and a second design that share a common interface with each other. The first and second design may be parameterized according to inputs provided by a user, or according to automatic processes executed by a design tool used to generate the logic description. Based on the inputs received by the computing system, the logic description may be generated. The wrapper module may include a first design within a reconfigurable region of the programmable logic device and may be included in a logic description. The wrapper module may receive a parameter that indicates that the design represented by the wrapper module should change from the first design to the second design. The change may occur while the simulation is running.

In various embodiments, a simulatable source file may be generated. The simulatable source file may be used when simulating the logic description in a hardware simulator. The wrapper module of the simulatable source file may be configured to change from a first design to a second design in response to receiving a run-time parameter.

According to particular embodiments, a synthesizable source file may be generated. The synthesizable source file may be used when compiling the logic description into hardware, such as a programmable logic device. The wrapper module of the synthesizable source file may be configured to change from a first design to a second design in response to receiving a compile-time parameter.

DESCRIPTION OF PARTICULAR EMBODIMENTS

Figure 1:
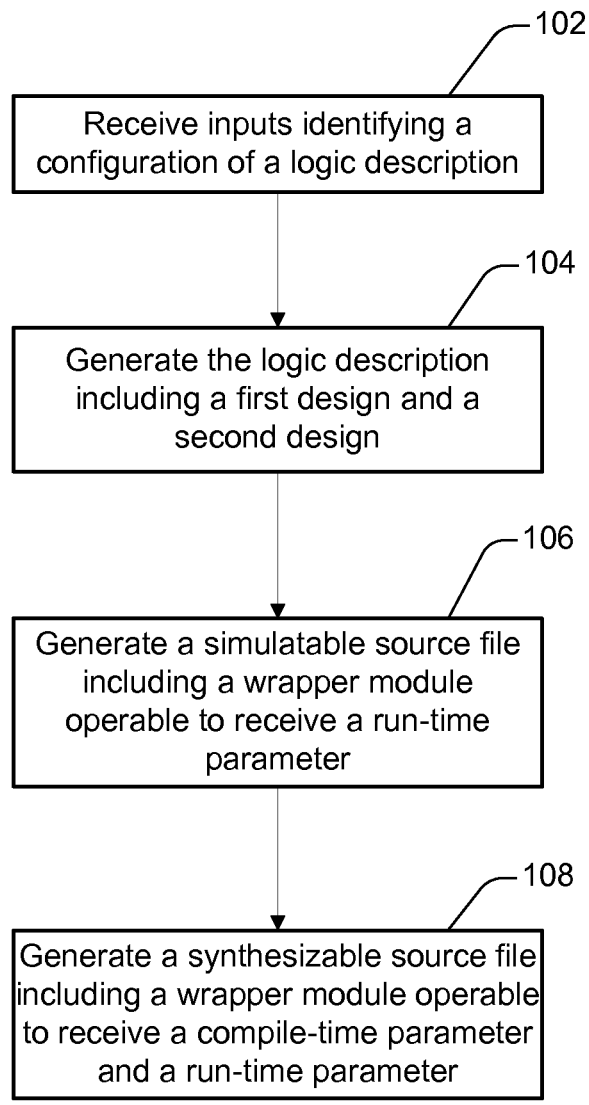
FIG. 1 illustrates an exemplary process for generating source files to simulate partial reconfiguration of a programmable logic device (PLD) in accordance with one embodiment.

Reference will now be made in detail to embodiments of the present invention. Examples of these embodiments are illustrated in the accompanying drawings. While the invention is described in conjunction with these embodiments, it will be understood that it is not intended to limit the invention to the described embodiments. On the contrary, it is intended to cover alternatives, modifications, and equivalents as may be included within the spirit and scope of the invention as defined by the appended claims.

For example, the techniques and mechanisms of the present invention will be described in the context of particular types of devices. However, it should be noted that the techniques and mechanisms of the present invention apply to a variety of different types of devices. In the following description, numerous specific details are set forth in order to provide a thorough understanding of the present invention. Particular exemplary embodiments of the present invention may be implemented without some or all of these specific details. In other instances, well known process operations have not been described in detail in order not to unnecessarily obscure the present invention.

Various techniques and mechanisms of the present invention will sometimes be described in singular form for clarity. However, it should be noted that various embodiments may include multiple iterations of a technique or multiple instantiations of a mechanism unless noted otherwise. For example, a system may use a processor in a variety of contexts. However, it will be appreciated that a system can use multiple processors while remaining within the scope of the present invention unless otherwise noted. Furthermore, the techniques and mechanisms of the present invention will sometimes describe a connection between two entities. It should be noted that a connection between two entities does not necessarily mean a direct, unimpeded connection, as a variety of other entities may reside between the two entities. For example, a processor may be connected to a memory component, but it will be appreciated that a variety of bridges and controllers may reside between the processor and memory. Consequently, a connection does not necessarily mean a direct, unimpeded connection unless otherwise noted.

Partial reconfiguration is a process in which a reconfigurable logic region(s) of a programmable logic device may be reconfigured with a new functionality while a fixed logic region(s) of the programmable logic device remains fixed, and continues to execute already implemented functionality. Partial reconfiguration may take place as the programmable logic device is running.

Conventional hardware simulators do not support the ability to simulate partial reconfiguration effectively. Various conventional hardware simulation systems lack the ability to switch different versions of code representing different instantiations of logic while the hardware simulator is running. Accordingly, if conventional methods are used to simulate partial reconfiguration, the simulation must run a first segment of code in a first source file. The simulation must then stop and compile a new segment of code to create a new source file. Once the new segment of code has been compiled, the new source file may be simulated. Interrupting the simulation of a logic description during partial reconfiguration prevents effective simulation of the temporal behavior of the implemented logic description.

Embodiments of the present invention allow a hardware simulator to simulate partial reconfiguration while the hardware simulator is running. Thus, according to various embodiments, different versions of code representing different instantiations of logic may be changed mid-simulation. This may be accomplished by incorporating a wrapper module into the source file. The wrapper module may associate a first design with a logic region that will undergo partial reconfiguration. The wrapper module may receive a parameter. The parameter may identify a second design that the wrapper module should associate with the logic region. Accordingly, in response to receiving the parameter, the wrapper module may associate the second design with the logic region, and a new segment of code may be executed. The change may occur while the simulation continues to run.

In various embodiments, the source file may be a simulatable source file that may receive a parameter while the hardware simulation is running in a hardware simulation program. In various embodiments, the source file may be a synthesizable source file that may receive a parameter when the logic description is compiled into hardware, such as a programmable logic device.

FIG. 1 illustrates an exemplary process for generating source files to simulate partial reconfiguration of a programmable logic device (PLD) in accordance with one embodiment. According to various embodiments of the present invention, the operation of a programmable logic device may be simulated as the device undergoes partial reconfiguration.

At step 102, an input identifying a configuration of a logic description to be implemented in the PLD is received. The input may be received at an interface of a computing system used to simulate partial reconfiguration of the PLD. In one embodiment the input may identify all designs that are included in the logic description. The design may, for example, be associated with a particular hardware component, or particular logic functionality. Thus, a design may refer to a logic design, an instantiation of a logic design, a logic function, or a hardware component that may be active when implemented in a PLD. The design may be implemented in either a fixed logic region or a reconfigurable logic region. In the context of simulation of the logic description, a design may be a module of code included in a simulatable source file. The module of code may have associated inputs and outputs. The inputs and outputs associated with the module of code may simulate the behavior of inputs and outputs of a design, such as a hardware component or a logic function.

At step 104, process 100 may generate a logic description based on the configuration identified by the input received at the computing system. The logic description may include a first design and a second design. When generating the logic description, at step 106, process 100 may generate a simulatable source file. A simulatable source file may be a source file including a logic description that is simulated in a simulation program. The simulation program may simulate the behavior of a design over time. The simulatable source file may include all designs identified by the input received at the computing system.

In various embodiments, the simulatable source file includes a wrapper module. The wrapper module may provide a constant interface between the simulation program and the design that is being simulated. As previously discussed, a constant interface may refer to a communicative interface between a fixed region and a reconfigurable region that provides the ability to communicate between regions regardless of what design is implemented within the reconfigurable region during partial reconfiguration. For example, compiled source code including the wrapper module may remain constant. However, in response to receiving a parameter, the wrapper module may associate different inputs and outputs corresponding to different designs with an already compiled module of code. Thus, the wrapper module may associate different designs, and different instantiations of those designs, with a compiled module of code in response to receiving a parameter, and while the simulation continues to run. Because the simulatable source file includes all instantiations of all designs identified by the input received at the computing system, recompilation of the simulatable source file is not required when the simulation transitions from a first design to a second design.

At step 108, process 100 may generate a synthesizable source file. A synthesizable source file may be a source file containing a logic description that is compiled into hardware. Thus, the synthesizable source file may be compiled into a physically realizable gate netlist, such as an electronic design interchange format (EDF) file which may be implemented on a programmable logic device.

In particular embodiments, the wrapper module of the synthesizable source file provides a constant interface between a program, such as a synthesis tool used to compile the source file, and the design to be implemented. The wrapper module may include a logic description of a first design. According to various embodiments, a compiler compiles the synthesizable source file into hardware while the wrapper module includes the first design. During partial reconfiguration, the synthesizable source file may be recompiled to implement a second design including a new functionality. During recompilation, the wrapper module may receive a compile-time parameter that identifies the second design. The wrapper module may generate code to include a logic description of the second design into the synthesizable source file. The compiler may then re-compile the synthesizable source file while the wrapper module includes the second design.

According to various embodiments, designs may be grouped into designs that are physically present in a device at the same time, and designs that are not physically present at the same time. For designs physically present at the same time, multiplexing logic may determine which designs are active by directing switching between designs in response to receiving a run-time parameter. For designs not physically present at the same time, partial reconfiguration may determine which designs are active by directing switching between designs in response to receiving a compile-time parameter.

According to various embodiments, if all designs are included in a single group, then all designs may be implemented so that they are physically present in the PLD at the same time. In particular embodiments, if each design is its own separate group, then the designs are not physically present in the PLD at the same time. In another example, some designs are included in the same group as each other, while the rest of the designs are included in other groups. The designs included in the same group are physically present in the PLD at the same time. Thus, the run-time parameter may direct switching between designs included in the same group via multiplexing logic. The compile-time parameter may direct switching between designs that belong to different groups via partial reconfiguration.

Figure 2:
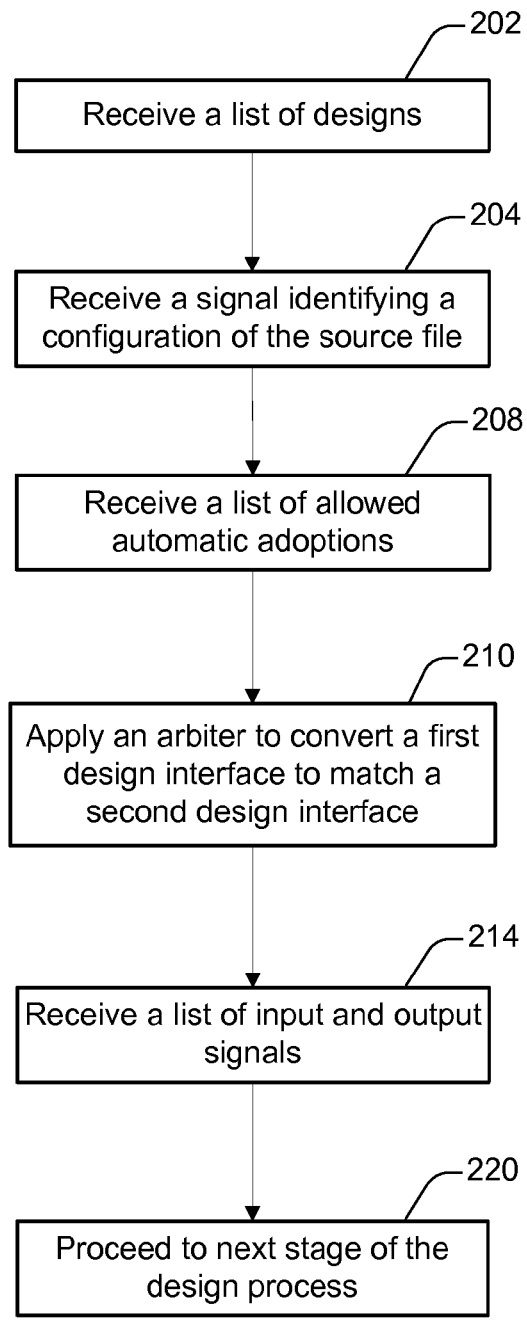
FIG. 2 illustrates an exemplary process for receiving inputs to generate a source file for partial reconfiguration simulation in accordance with one embodiment.

FIG. 2 illustrates an exemplary process for receiving inputs to generate a source file for partial reconfiguration simulation in accordance with one embodiment. In various embodiments, at step 202, a design tool may receive, via an input to a computing system, a list of all designs included in a logic description that may be implemented in a PLD. Each design may be parameterizable. Thus, the input received at the computing system may additionally modify various parameters associated with a hardware component included in a design. Exemplary parameters may be latency, power consumption, and throughput of the hardware component, to name a few. Once the list of designs has been received, at step 204, the input may also identify a configuration of the source file. For example, the signal may identify instantiations of designs that will be implemented and active when the logic description is implemented on the PLD.

At step 208, the design tool may receive a list of allowed automatic adoptions associated with a design interface of a design. In various embodiments, an automatic adoption may refer to an automatic selection made by the design tool according to a predetermined setting and in response to receiving a design. According to various embodiments, each design may include a design interface that serves as communicative interface. If a first design is implemented in a first logic region, and a second design is implemented in a second logic region adjacent to the first logic region, the two designs may communicate with each other via their respective design interfaces. Communication between the two designs may be possible when a first design interface included in the first design is the same type of interface as a second design interface included in the second design. Thus, the list of allowed automatic adoptions may identify several types of design interfaces that an arbiter may automatically convert a design interface to. Automatic conversion to a particular type of design interface ensures that different designs will have the same type of design interface and will be able to communicate with each other.

At 210, an arbiter may automatically change a design interface from a first design interface to a second design interface based on the list of allowed automatic adoptions. For example, a design interface, such as an Avalon interface, may be identified by the list of automatic adoptions. The Avalon interface refers to a specific type of bus fabric that may provide a communicative interface between a first design and another portion of the programmable logic device, such as second design. The arbiter may automatically convert a different design interface, such as an Advanced Microcontroller Bus Architecture (AMBA) interface, to the Avalon interface. The input received at the computing system may specify that the design tool automatically performs this conversion when the list of designs received. Once the list of automatic adoptions has been received, process 200 may proceed to step 214.

According to various embodiments, at step 214, the design tool may receive a list of input and output signals. The design tool may configure the source file to receive and provide the identified input and output signals during simulation. For example, the list of input signals may identify a sub-system reset input. The sub-system reset input may allow an input signal to reset a specific portion of the system being simulated, such as a design implemented in a reconfigurable logic region. For example, if a design implemented in a logic region has just been reconfigured, the sub-system reset input may reset that logic region while the rest of the system continues to run uninterrupted. Furthermore, according to various embodiments, the source file may provide output signals that provide information about logic regions that are undergoing partial reconfiguration. For example, if a processor core is implemented in a reconfigurable logic region, and the reconfigurable logic region undergoes partial reconfiguration, an output signal from the reconfigurable logic region may indicate that the processor core is undergoing partial reconfiguration. Such an output signal may be provided to a fixed logic region implemented on the same programmable logic device as the reconfigurable logic region. Moreover, in particular embodiments, the list of signals may include a list of signals that have predetermined properties during partial reconfiguration. For example, an output from a reconfigurable region of logic may be held at a value of "X" corresponding to an indeterminate state, a last known value, "1," and "0."

According to particular embodiments, at step 220, the design tool may proceed to the next stage of the design process. In various embodiments, the design tool may proceed to generate the simulatable source file. The design tool may also generate a synthesizable source file.

Figure 3:
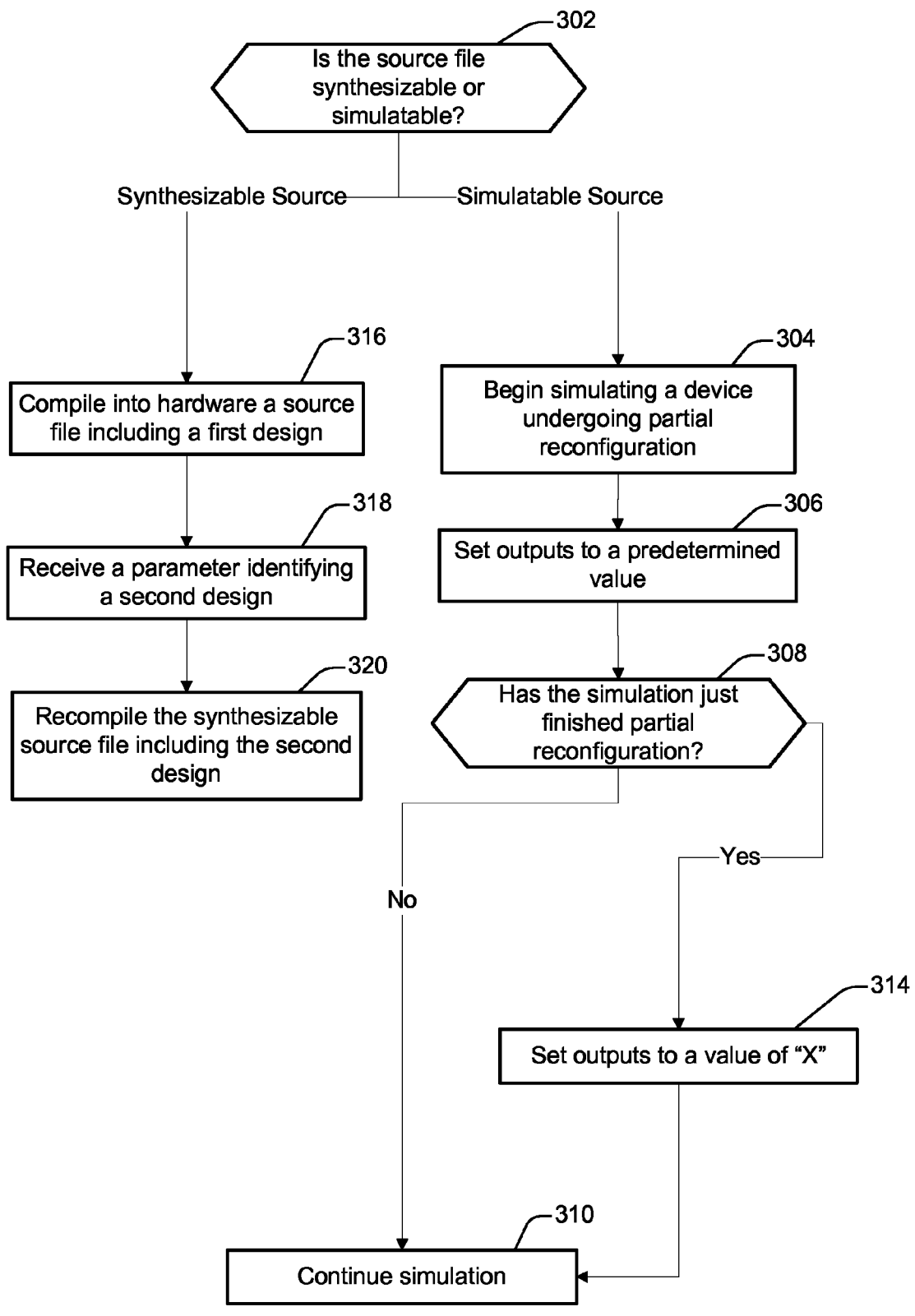
FIG. 3 illustrates an exemplary process for simulating a source file in accordance with one embodiment.

FIG. 3 illustrates an exemplary process for simulating a source file in accordance with one embodiment. In various embodiments, at step 302, process 300 may determine if the source file is a simulatable source file or a synthesizable source file. If the source file is a simulatable source file, process 300 may proceed to step 304.

According to particular embodiments, at step 304, process 300 may begin simulating the logic description included in the simulatable source file. At step 304, process 300 may begin simulation of partial reconfiguration of the logic description. Thus, according to various embodiments, the logic description of the simulatable source file may be partially reconfigured while the simulation continues to run. As discussed above, a wrapper module included in the simulatable source file may be associated with a reconfigurable logic region of a programmable logic device. The reconfigurable logic region may be reconfigured with new functionality during partial reconfiguration. Accordingly, the wrapper module may initially associate a first design with the reconfigurable logic region. The wrapper module may receive a run-time parameter during simulation. The parameter may identify a second design. In response to receiving the parameter, the wrapper module may associate the second design with the reconfigurable logic region. Thus, the parameter may direct switching from the first design to the second design during simulation of partial reconfiguration of the PLD.

For example, a logic description for a reconfigurable logic region in a muxponder may be simulated. The muxponder may receive several lanes, each of which carries a signal at a certain frequency and operates independently according to a networking protocol. The muxponder may multiplex the lanes into a single combined protocol operating at a higher speed or frequency. The reconfigurable logic region may determine a networking protocol for a lane received at the muxponder. A wrapper module included in the simulatable source file may be associated with the reconfigurable logic region. Thus, the wrapper module may associate a first design with the reconfigurable logic region. The first design may configure the lane received at a muxponder to operate in accordance with an Ethernet protocol. During simulation of partial reconfiguration, the wrapper module may receive a parameter identifying a SDI protocol. In response to receiving the parameter, the wrapper module may associate a second design with the reconfigurable logic region. The second design may configure the lane to operate in accordance with a SDI protocol.

At step 306, all of the outputs, or an identified subset of the outputs, of the logic region undergoing partial reconfiguration may be held at a predetermined value during the process of reconfiguration. At step 308, process 300 may determine if the simulation has finished simulating partial reconfiguration of the source file. If it is determined that the simulation has not finished simulation of partial reconfiguration, at step 310, a signal received at a test bench in communication with the simulation tool may specify how simulation of the source file to continue. If, at step 308 it is determined that the simulation has finished partial reconfiguration, at step 314, the simulation tool may set the outputs, or an identified subset of outputs, of a logic region to a value of "X" after simulation of the logic region has finished partial reconfiguration. In various embodiments, this value may continue to be asserted until a sub-system reset occurs. After the outputs of the logic region, or subset thereof, have been set to a value of "X", at step 310, process 300 may continue simulation of the logic description as specified by the signal received at the test bench.

If, at step 302, it is determined that the source file is a synthesizable source file, at step 316, a compiler may compile the synthesizable source file into hardware, such as a programmable logic device. In various embodiments, the synthesizable source file may include a wrapper module associated with a reconfigurable logic region of the programmable logic device. The wrapper module may include a first design. During partial reconfiguration, the compiler may recompile the synthesizable source file to implement a new functionality. Accordingly, at step 318, the wrapper module may receive a parameter identifying a second design during recompilation of the synthesizable source file. In response to receiving the parameter, the wrapper module may associate the second design with the reconfigurable logic region. At step 320, the compiler may finish recompiling the synthesizable source file which now includes the second design, and may be implemented in the programmable logic device.

For example, a logic description of a reconfigurable logic region in a muxponder may be implemented. The logic description may include a wrapper module. The wrapper module may include a first design that configures a lane received at a muxponder to operate according to an Ethernet protocol. During partial reconfiguration, the logic description of the reconfigurable logic region may be recompiled to implement a new functionality. The wrapper module may receive a parameter during recompilation. The parameter may identify a SDI protocol. In response to receiving the parameter, the wrapper module may include the second design and configure the lane received at the muxponder to operate according to a SDI protocol. The compiler may finish recompiling the logic description, and the logic description may be implemented in the programmable logic device. After the logic description has been implemented, the lane received at the muxponder may operate in accordance with a SDI protocol.

TABLE 1

| Compilation | Simulation |
|---|---|
| parameter NONE = 0;<br>parameter ETH_10G_baseR = 1;<br>parameter SDI_10G = 2;<br>module lane (<br>    input    clk,<br>    input    reset,<br>    input [63:0]    data_in,<br>    input    data_in_valid,<br>    input    sop_in, eop_in,<br>    output reg [63:0] data_out,<br>    output reg data_out_valid,<br>    output reg sop_out,<br>    output reg eop_out,<br>    output reg link_valid_n<br>);<br>    parameter<br>PROTOCOL=ETH_10G_baseR; | parameter NONE = 0;<br>parameter ETH_10G_baseR = 1;<br>parameter SDI_10G = 2;<br>module lane (<br>    input    clk,<br>    input    reset,<br>    input [63:0]    data_in,<br>    input    data_in_valid,<br>    input    sop_in, eop_in,<br>    output reg [63:0] data_out,<br>    output reg data_out_valid,<br>    output reg sop_out,<br>    output reg eop_out,<br>    output reg link_valid_n,<br>);<br>reg protocol;<br>ETH_10GbaseR ch_10G_baseR (<br>  .clk(clk),<br>  .data_in(data_in_10G_baseR),<br>  .data_out(data_out_10G_baseR)<br>);<br>SDI_10G ch_SDI_10G (<br>  .clk(clk),<br>  .data_in(data_in_SDI_10G),<br>  .data_out(data_out_SDI_10G) |

TABLE 1-continued

| Compilation | Simulation |
|---|---|
| generate<br>  case (PROTOCOL)<br>    ETH_10G_baseR:<br>      begin<br>        ETH_10G_baseR_ch (<br>          .clk(clk),<br>          .data_in(data_in),<br>          ...<br>        );<br>      end<br>    SDI_10G:<br>      begin<br>        SDI_10G_ch (<br>          .clk(clk),<br>          .data_in(data_in),<br>        );<br>      end<br>  endcase<br>endgenerate<br>endmodule | // assign inputs<br>assign data_in_10G_baseR = data_in;<br>assign data_in_SDI_10G = data_in;<br>// case statement to determine output<br>always@(*)<br>begin<br>  case (protocol)<br>    NONE: // all outputs tied high<br>      begin<br>        data_out = 64'b1;<br>      end<br>    ETH_10G_baseR:<br>      begin<br>        data_out = data_out_10G_baseR;<br>      end<br>    SDI_10G:<br>      begin<br>        data_out = data_out_SDI_10G;<br>      end<br>  endcase<br>end<br>endmodule |

Table 1 contains an exemplary side-by-side illustration of source files for both simulation and compilation. As previously discussed, the source files may include wrapper modules.

The compilation side of Table 1 illustrates a wrapper module that may be included in a synthesizable source file created by, for example, process 200. As shown by the compilation side, the synthesizable source file may include a wrapper module with various associated inputs and outputs. Moreover, an input received at the computing system may set the parameter (in this example, protocol), thus identifying which instantiation of the design the wrapper module associates with the reconfigurable logic region. The setting of internal variables of the wrapper module of the synthesizable source file may require traversal of the module interface. Accordingly, subsequent changes in the value of the parameter may require recompilation of the hardware description language code.

The simulation side illustrates a wrapper module that may be included in a simulatable source file also created by, for example, process 200. In the simulatable source file, the parameter is not set. Accordingly, the function interface of the module stays constant because simulation of a source file written in a hardware description language, such as Verilog and VHDL, allows for one module to directly set an internal variable in another module without traversal of the module interface. Accordingly, there is no need for recompilation.

TABLE 2

```
`timescale 1ns/1ps
module lane_tb;
reg clk, reset;
reg [63:0] data_in;
reg data_in_valid;
reg sop_in, eop_in
wire [63:0] data_out;
wire data_out_valid;
wire sop_out;
wire eop_out;
wire link_valid_n;
always
```

TABLE 2-continued

```
begin
    #4 clk = ~clk;
end
lane m_lane
(
    .clk(clk),
    .reset(reset),
    .data_in(data_in),
    .data_in_valid(data_in_valid),
    .data_out(data_out),
    .data_out_valid(data_out_valid),
    .sop_out(sop_out),
    .eop_out(eop_out),
    .link_valid_n(link_valid_n)
)
// example of setting protocol variable in a behavioral simulation
always @(start_reconfig_test)
begin
    if (TESTING_ETHERNET)
    begin
        m_lane.protocol <= ETH_10G_BASER;
    end
    else if (TESTING_SDI)
    begin
        m_lane.protocol <= SDI_10G;
    end
end
endmodule
```

Table 2 illustrates an exemplary test bench executing a simulatable source file including a wrapper module, as described above. Table 2 further illustrates how the wrapper module of the simulatable source file may be called, and how the value of the parameter changes various inputs and outputs associated with the wrapper module. More specifically, Table 2 illustrates that different code representing a different design is instantiated each time the value of the parameter changes. For example, a first value of a parameter may call an Ethernet module instantiating an Ethernet protocol, while a second value of the parameter may call a SDI module instantiating a SDI protocol. According to various embodiments, the designs are not entirely different. For example, the same design may be instantiated with different parameterization. For example, a multiplier may be implemented. In response to receiving a parameter, a multiplier with different hardware attributes, such as latency, power consumption, or throughput may be instantiated.

Figure 4:
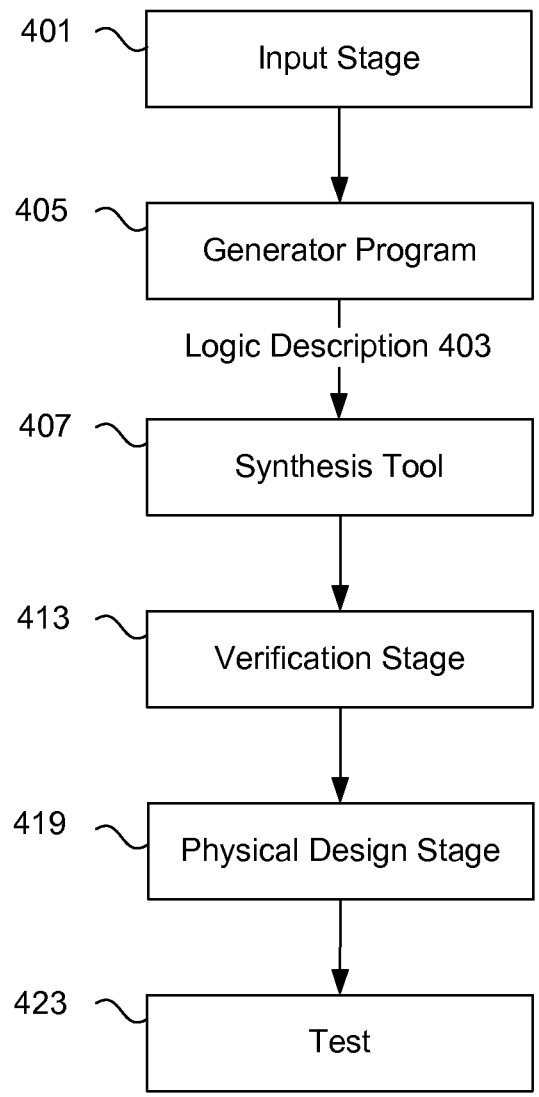
FIG. 4 illustrates an exemplary technique for implementing a programmable chip in accordance with one embodiment.

FIG. 4 illustrates an exemplary technique for simulating and implementing a programmable chip in accordance with one embodiment. Such a technique may be used to simulate and implement a programmable logic device (PLD), as discussed above. An input stage 401 receives selection information typically from a user for logic such as a processor core as well as other components to be implemented on an electronic device. In one example, the input received is in the form of a high-level language program. A generator program 405 creates a logic description 403 and provides the logic description along 403 with other customized logic to any of a variety of synthesis tools, place and route programs, and logic configuration tools to allow a logic description to be implemented on an electronic device.

In one example, an input stage 401 often allows selection and parameterization of components to be used on an electronic device. The input stage 401 also allows configuration of hard coded logic. In some examples, components provided to an input stage include intellectual property functions, megafunctions, and intellectual property cores. The input stage 401 may be a graphical user interface using wizards for allowing efficient or convenient entry of information. The input stage may also be a text interface or a program reading a data file such as a spreadsheet, database table, or schematic to acquire selection information. The input stage 401 produces an output containing information about the various modules selected. At this stage, the user may enter security information about individual components that needs to be isolated. For example, different levels of component security and which components are allowed to communicate with each other may be entered.

In typical implementations, the generator program 405 can identify the selections and generate a logic description with information for implementing the various modules. The generator program 405 can be a Perl script creating HDL files such as Verilog, Abel, VHDL, and AHDL files from the module information entered by a user. In one example, the generator program identifies a portion of a high-level language program to accelerate. The other code is left for execution on a processor core. According to various embodiments, the generator program 405 identifies pointers and provides ports for each pointer. One tool with generator program capabilities is System on a Programmable Chip (SOPC) Builder available from Altera Corporation of San Jose, Calif. The generator program 405 also provides information to a synthesis tool 407 to allow HDL files to be automatically synthesized. In some examples, a logic description is provided directly by a designer. Hookups between various components selected by a user are also interconnected by a generator program. Some of the available synthesis tools are Leonardo Spectrum, available from Mentor Graphics Corporation of Wilsonville, Oreg. and Synplify available from Synplicity Corporation of Sunnyvale, Calif. The HDL files may contain technology specific code readable only by a synthesis tool. The HDL files at this point may also be passed to a simulation tool.

As will be appreciated by one of skill in the art, the input stage 401, generator program 405, and synthesis tool 407 can be separate programs. The interface between the separate programs can be a database file, a log, or simply messages transmitted between the programs. For example, instead of writing a file to storage, the input stage 401 can send messages directly to the generator program 405 to allow the generator program to create a logic description. Similarly, the generator program can provide information directly to the synthesis tool instead of writing HDL files. Similarly, input stage 401, generator program 405, and synthesis tool 407 can be integrated into a single program.

A user may select various modules and an integrated program can then take the user selections and output a logic description in the form of a synthesized netlist without intermediate files. Any mechanism for depicting the logic to be implemented on an electronic device is referred to herein as a logic description. According to various embodiments, a logic description is an HDL file such as a VHDL, Abel, AHDL, or Verilog file. A logic description may be in various stages of processing between the user selection of components and parameters to the final configuration of the device. According to other embodiments, a logic description is a synthesized netlist such as an Electronic Design Interchange Format Input File (EDF file). An EDF file is one example of a synthesized netlist file that can be output by the synthesis tool 407.

A synthesis tool 407 can take HDL files and output EDF files. Tools for synthesis allow the implementation of the logic design on an electronic device. Some of the available synthesis tools are Leonardo Spectrum, available from Mentor Graphics Corporation of Wilsonville, Oreg. and Synplify available from Synplicity Corporation of Sunnyvale, Calif. Various synthesized netlist formats will be appreciated by one of skill in the art.

A verification stage 413 typically follows the synthesis stage 407. The verification stage checks the accuracy of the design to ensure that an intermediate or final design realizes the expected requirements. A verification stage typically includes simulation tools and timing analysis tools. Tools for simulation allow the application of inputs and the observation of outputs without having to implement a physical device. Simulation tools provide designers with cost effective and efficient mechanisms for both functional and timing verification of a design. Functional verification involves the circuit's logical operation independent of timing considerations. Parameters such as gate delays are disregarded.

Timing verification involves the analysis of the design's operation with timing delays. Setup, hold, and other timing requirements for sequential devices such as flip-flops are confirmed. Some available simulation tools include Synopsys VCS, VSS, and Scirocco, available from Synopsys Corporation of Sunnyvale, Calif. and Cadence NC-Verilog and NC-VHDL available from Cadence Design Systems of San Jose, Calif. After the verification stage 413, the synthesized netlist file can be provided to physical design tools 419 including place and route and configuration tools. A place and route tool locates logic cells on specific logic elements of a target hardware device and connects wires between the inputs and outputs of the various logic elements in accordance with logic and security provided to implement an electronic design. According to various embodiments of the present invention, the place and route tool may perform the techniques of the present invention to implement the various security requirements and rules as defined by the user. The iterative technique may be transparent to the user, but the resulting device can be physically tested at 423.

For programmable logic devices, a programmable logic configuration stage can take the output of the place and route tool to program the logic device with the user selected and parameterized modules. According to various embodiments, the place and route tool and the logic configuration stage are provided in the Quartus Development Tool, available from Altera Corporation of San Jose, Calif. As will be appreciated by one of skill in the art, a variety of synthesis, place and route, and programmable logic configuration tools can be used using various techniques of the present invention.

As noted above, different stages and programs can be integrated in a variety of manners. According to one embodiment, the input stage 401, the generator program 405, the synthesis tool 407, the verification tools 413, and physical design tools 419 are integrated into a single program. The various stages are automatically run and transparent to a user. The program can receive the user-selected modules, generate a logic description depicting logic for implementing the various selected modules, and implement the electronic device. As will be appreciated by one of skill in the art, HDL files and EDF files are mere examples of a logic description. Other file formats as well as internal program representations are other examples of a logic description.

Figure 5:
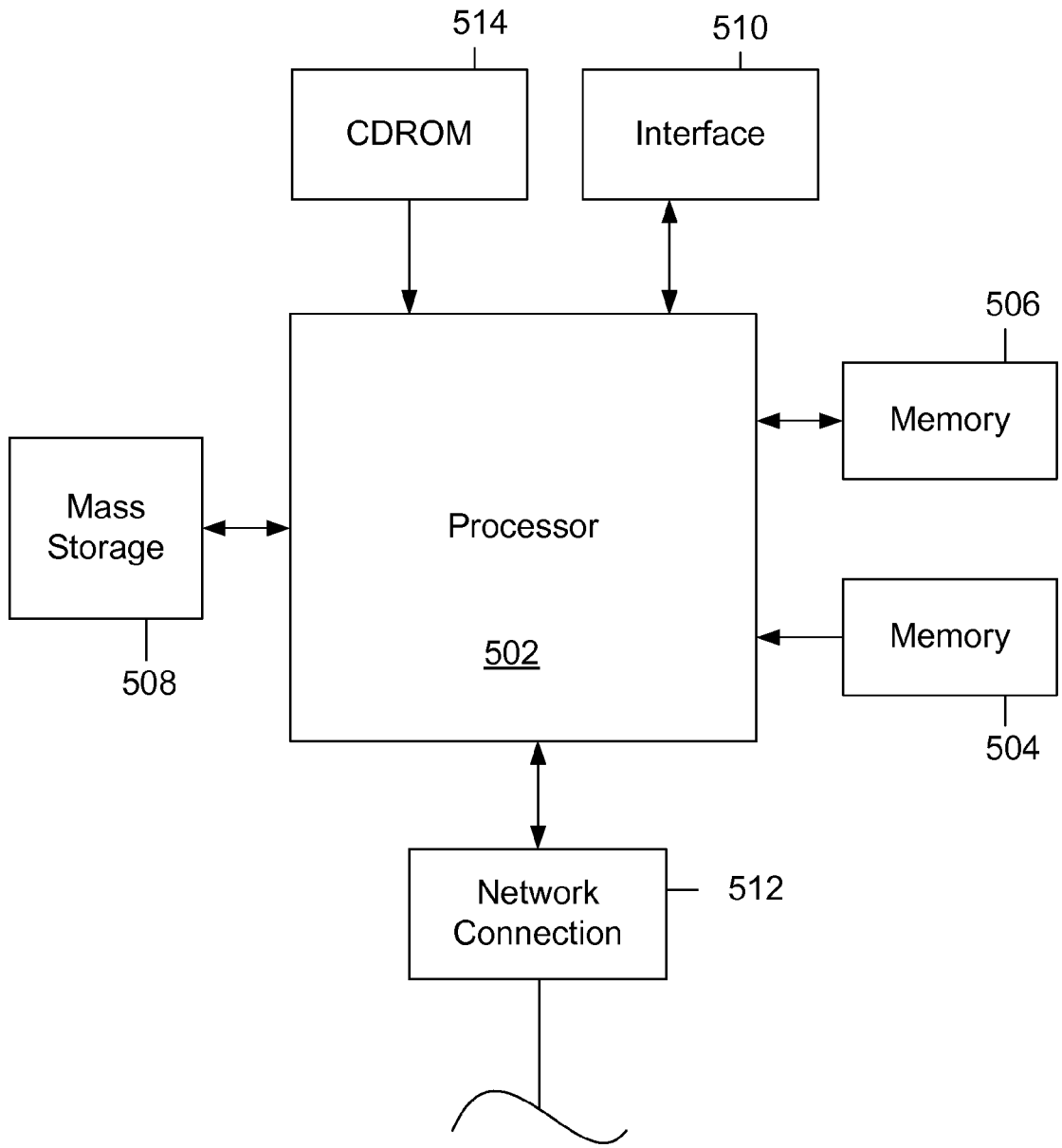
FIG. 5 illustrates one example of a computer system in accordance with one embodiment.

FIG. 5 illustrates one example of a computer system, in accordance with one embodiment. In various embodiments, the computing system may be used to simulate partial reconfiguration of a PLD. The computer system 500 includes any number of processors 502 (also referred to as central processing units, or CPUs) that are coupled to devices including memory component 506 (typically a random access memory, or "RAM"), memory component 504 (typically a read only memory, or "ROM"). The processors 502 can be configured to generate an electronic design. As is well known in the art, memory component 504 acts to transfer data and instructions uni-directionally to the CPU and memory component 506 are used typically to transfer data and instructions in a bi-directional manner.

Both of these memory devices may include any suitable type of the computer-readable media described above. A mass storage device 508 is also coupled bi-directionally to CPU 502 and provides additional data storage capacity and may include any of the computer-readable media described above. The mass storage device 508 may be used to store programs, data and the like and is typically a secondary storage medium such as a hard disk that is slower than memory. The mass storage device 508 can be used to hold a library or database of prepackaged logic or intellectual property functions, as well as information on generating particular configurations. It will be appreciated that the information retained within the mass storage device 508, may, in appropriate cases, be incorporated in standard fashion as part of memory component 506 as virtual memory. A specific mass storage device such as a CD-ROM 514 may also pass data uni-directionally to the CPU.

CPU 502 is also coupled to an interface 510 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. The CPU 502 may be a design tool processor. Finally, CPU 502 optionally may be coupled to a computer or telecommunications network using a network connection as shown generally at 512. With such a network connection, it is contemplated that the CPU might receive information from the network, or might output information to the network in the course of performing the above-described process steps. It should be noted that the system 500 might also be associated with devices for transferring completed designs onto a programmable chip. The above-described devices and materials will be familiar to those of skill in the computer hardware and software arts.

Although many of the components and processes are described above in the singular for convenience, it will be appreciated by one of skill in the art that multiple components and repeated processes can also be used to practice the techniques of the present invention.

While particular embodiments of the invention have been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of components and should not be restricted to the ones mentioned above. It is therefore intended that the invention be interpreted to include all variations and equivalents that fall within the true spirit and scope of the present invention.

What is claimed is:

1. A method comprising:
    in a computing system, simulating a device including a fixed logic region and a plurality of reconfigurable logic regions, the fixed logic region for performing fixed functionality and the plurality of reconfigurable logic regions reconfigurable for performing functionalities associated with a plurality of designs, wherein the plurality of designs includes a first design and a second design; and
    receiving a run-time parameter and reconfiguring at least one reconfigurable region of the plurality of reconfigurable logic regions from the first design to the second design in response to the run-time parameter while simulation of the device is running; and
    identifying at least one output signal that has a value corresponding to an indeterminate state after the reconfiguring of the at least one reconfigurable region and before a sub-system reset of the at least one reconfigurable logic region.

2. The method of claim 1, wherein the fixed logic region, and two reconfigurable logic regions of the plurality of reconfigurable logic regions, implementing the first and the second design respectively, share a common interface.

3. The method of claim 1, wherein a reconfigurable logic region includes a wrapper module for receiving the run-time parameter that directs switching from the first design to the second design.

4. The method of claim 1 further comprising:
    receiving a list of the plurality of designs;
    receiving a signal identifying a configuration of the plurality of designs;
    receiving a list of signals having predetermined properties during partial reconfiguration;
    receiving a list of allowed interfaces for converting a first interface to a second interface; and
    converting the first interface to the second interface, the second interface among the list of allowed interfaces.

5. The method of claim 4, wherein the first interface is an advanced microcontroller bus architecture (AMBA) interface and the second interface is an Avalon interface.

6. The method of claim 1 further comprising:
    receiving a signal that resets a design; and
    receiving a signal identifying at least one reconfigurable logic region of the plurality of reconfigurable logic regions that generates an output signal, wherein the output signal notifies the fixed logic region that the at least one reconfigurable logic region of the plurality of reconfigurable logic regions is undergoing partial reconfiguration.

7. The method of claim 1 further comprising:
    determining that the first design has a first interface different than a second interface of the second design; and
    in response to the first design having the first interface that is different from the second interface of the second design, applying an arbiter to convert the first interface to be the same as the second interface.

8. The method of claim 1 further comprising:
generating a synthesizable source file operable to switch from the first design to the second design in response to receiving a compile-time parameter; and
generating a simulatable source file for switching from the first design to the second design in response to receiving a run-time parameter.

9. The method of claim 8, wherein the simulatable source file is operable to:
identify inputs to a wrapper module that have a specified property;
identify a value of at least one output signal during partial reconfiguration, wherein the value is selected from a group consisting of: indeterminate, last value, 1, and 0, wherein the at least one output signal originates from the at least one reconfigurable logic region.

10. The method of claim 1 further comprising assigning each design of the plurality of designs to a group,
wherein designs included in a first group are switched in response to receiving a run-time parameter, and
wherein designs included in a second group are switched in response to receiving a compile-time parameter.

11. A system comprising:
a processor for simulating a device including a fixed logic region and a plurality of reconfigurable logic regions, the fixed logic region for performing fixed functionality and the plurality of reconfigurable logic regions reconfigurable and for performing functionalities associated with a plurality of designs, wherein the plurality of designs includes a first design and a second design; and
an interface for receiving a run-time parameter and reconfiguring at least one reconfigurable region of the plurality of reconfigurable logic regions from the first design to the second design in response to the run-time parameter while simulation of the device is running; and
identifying at least one output signal that has a value corresponding to an indeterminate state after the reconfiguring of the at least one reconfigurable region and before a sub-system reset of the at least one reconfigurable logic region.

12. The system of claim 11, wherein a reconfigurable logic region includes a wrapper module for receiving the run-time parameter that directs switching from the first design to the second design.

13. The system of claim 11, wherein the interface is further for:
receiving a list of the plurality of designs;
receiving a signal identifying a configuration of the plurality of designs;
receiving a list of signals having predetermined properties during partial reconfiguration;
receiving a list of allowed interfaces for converting a first interface to a second interface; and
converting the first interface to the second interface, the second interface among the list of allowed interfaces.

14. The system of claim 11, wherein the processor is further for:
generating a synthesizable source file operable to switch from the first design to the second design in response to receiving a compile-time parameter; and
generating a simulatable source file for switching from the first design to the second design in response to receiving a run-time parameter.

15. The system of claim 14, wherein the simulatable source is further for:
identifying inputs to a wrapper module that have a specified property;
identifying a value of at least one output signal during partial reconfiguration, wherein the value is selected from a group consisting of: indeterminate, last value, 1, and 0, wherein the at least one output signal originates from the at least one reconfigurable logic region.

16. The system of claim 11, wherein the interface is operable to receive an input that assigns each design of the plurality of designs to a group,
wherein designs included in a first group are switched in response to receiving a run-time parameter, and
wherein designs included in a second group are switched in response to receiving a compile-time parameter.

17. A non-transitory computer readable storage medium comprising computer code embodied therein, the computer readable storage medium comprising:
computer code for simulating a device including a fixed logic region and a plurality of reconfigurable logic regions, the fixed logic region for performing fixed functionality and the plurality of reconfigurable logic regions reconfigurable and for performing functionalities associated with a plurality of designs, wherein the plurality of designs includes a first design and a second design; and
computer code for receiving a run-time parameter and reconfiguring at least one reconfigurable region of the plurality of reconfigurable logic regions from the first design to the second design in response to the run-time parameter while simulation of the device is running; and
identifying at least one output signal that has a value corresponding to an indeterminate state after the reconfiguring of the at least one reconfigurable region and before a sub-system reset of the at least one reconfigurable logic region.

18. The non-transitory computer readable storage medium of claim 17 further comprising:
computer code for generating a synthesizable source file operable to switch from the first design to the second design in response to receiving a compile-time parameter; and
computer code for generating a simulatable source file operable to switch from the first design to the second design in response to receiving a run-time parameter.

19. The non-transitory computer readable storage medium of claim 18, wherein the simulatable source file is further for:
identifying inputs to a wrapper module that have a specified property;
identifying a value of at least one output signal during partial reconfiguration, wherein the value is selected from a group consisting of: indeterminate, last value, 1, and 0, wherein the at least one output signal originates from the at least one reconfigurable logic region.

20. The non-transitory computer readable storage medium of claim 17 further comprising code for assigning each design of the plurality of designs to a group,
wherein designs included in a first group are switched in response to receiving a run-time parameter, and
wherein designs included in a second group are switched in response to receiving a compile-time parameter.

* * * * *